(12) United States Patent
Li et al.

(10) Patent No.: US 12,130,649 B2
(45) Date of Patent: Oct. 29, 2024

(54) BIAS CURRENT GENERATION CIRCUIT AND FLASH MEMORY

(71) Applicant: CSMC TECHNOLOGIES FAB2 CO., LTD., Jiangsu (CN)

(72) Inventors: Youhui Li, Wuxi (CN); Lijuan Zhu, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 167 days.

(21) Appl. No.: 17/799,459

(22) PCT Filed: Dec. 9, 2020

(86) PCT No.: PCT/CN2020/134967
§ 371 (c)(1),
(2) Date: Aug. 12, 2022

(87) PCT Pub. No.: WO2021/218160
PCT Pub. Date: Nov. 4, 2021

(65) Prior Publication Data
US 2023/0095590 A1   Mar. 30, 2023

(30) Foreign Application Priority Data
Apr. 29, 2020   (CN) .......................... 202010353377.0

(51) Int. Cl.
*G11C 16/30* (2006.01)
*G05F 3/24* (2006.01)
(52) U.S. Cl.
CPC ................ *G05F 3/24* (2013.01); *G11C 16/30* (2013.01)

(58) Field of Classification Search
CPC ......... G11C 5/147; G11C 5/146; G11C 5/144; G11C 5/14; G11C 16/06; G11C 16/30; G05F 3/24
See application file for complete search history.

(56) References Cited

U.S. PATENT DOCUMENTS

2003/0011349 A1   1/2003   Kuroiwa et al.
2018/0076802 A1   3/2018   Holzmann

FOREIGN PATENT DOCUMENTS

| CN | 101387894 | 3/2009 |
| CN | 102545780 | 7/2012 |

(Continued)

OTHER PUBLICATIONS

Jacob Baker, CMOS Circuit Design, Layout, and Simulation, 2006, p. 97 and 322 (Year: 2006).*

(Continued)

*Primary Examiner* — Alfredo Bermudez Lozada
(74) *Attorney, Agent, or Firm* — Dority & Manning, P.A.

(57) ABSTRACT

A bias current generation circuit and a flash memory. The bias current generation circuit includes a voltage source, a switching circuit and a current generation circuit. The voltage source is configured to provide a voltage for generating a bias current. An input terminal of the switching circuit is connected to the voltage source, a control terminal of the switching circuit is configured to receive a control signal. The current generation circuit includes a first MOS transistor and a second MOS transistor, an input terminal and a control terminal of the first MOS transistor are connected to an output terminal of the switching circuit, an output terminal of the first MOS transistor is connected to an input terminal and a control terminal of the second MOS transistor, and an output terminal of the second MOS transistor is grounded.

17 Claims, 3 Drawing Sheets

(56) References Cited

FOREIGN PATENT DOCUMENTS

| | | |
|---|---|---|
| CN | 103858348 | 6/2014 |
| CN | 104517573 | 4/2015 |
| CN | 107015594 | 8/2017 |
| CN | 206379873 | 8/2017 |
| CN | 107390763 | 11/2017 |
| CN | 108664065 | 10/2018 |
| CN | 208314603 | 1/2019 |
| JP | 1992284007 A | 10/1992 |
| JP | 2003079138 A | 3/2003 |
| JP | 2006512632 A | 4/2006 |
| JP | 2009193211 A | 8/2009 |
| JP | 2010186360 A | 8/2010 |
| JP | 2010198092 A | 9/2010 |
| JP | 2013030830 | 2/2013 |
| JP | 2018076802 A | 5/2018 |
| JP | 2019102903 A | 6/2019 |
| KR | 100904467 | 6/2009 |

OTHER PUBLICATIONS

PCT International Search Report and Written Opinion (with English translation) for corresponding PCT Application No. PCT/CN2020/134967, mailed Feb. 26, 2021, 10 pages.
Chinese Office Action for corresponding Chinese Application No. 202010353377.0, dated Feb. 14, 2022, 7 pages.
Chinese Office Action for corresponding Chinese Application No. 202010353377.0, dated Jul. 5, 2022, 7 pages.
Notice of Reason for Refusal (w/ English translation) for corresponding Japanese Application No. 2022-562060, dated Nov. 7, 2023, 8 pages.

\* cited by examiner

BIAS CURRENT GENERATION CIRCUIT AND FLASH MEMORY

RELATED APPLICATION

This application is a national stage application of PCT international application PCT/CN2020/134967, filed on Dec. 9, 2020, which claims priority to Chinese Patent Application No. 202010353377.0, entitled "BIAS CURRENT GENERATION CIRCUIT AND FLASH MEMORY," filed on Apr. 29, 2020, both of which are hereby incorporated by reference in their entireties for all purposes.

TECHNICAL FIELD

The present disclosure relates to the semiconductor technology, and in particular to a bias current generation circuit and a flash memory.

BACKGROUND

Statements herein merely provide background information related to the present disclosure and do not necessarily constitute prior art.

As shown in FIG. 1, a conventional bias current generation circuit has two steady-state operation points, i.e., a state where a current is 0 ampere and a state where a current is under normal operation. The bias current generation circuit requires an enabling circuit to enable the circuit to switch from the state where the current is 0 ampere. However, the enabling circuit generally needs certain time to enable the bias current generation circuit to enter the state where the current is under normal operation, and a setting time for the bias current is relative long. A flash memory integrated design (i.e., a Flash IP) has a relatively high requirement on the setting time for the bias current, that is, the setting time for the bias current needs to be very short. Thus, this conventional bias current generation circuit would not meet the requirements of the Flash IP on the bias current.

SUMMARY

According to some embodiments of the present disclosure, a bias current generation circuit and a flash memory are provided.

The bias current generation circuit includes a voltage source, a switching circuit and a current generation circuit. The voltage source is configured to provide a voltage for generating a bias current. An input terminal of the switching circuit is connected to the voltage source, a control terminal of the switching circuit is configured to receive a control signal and to control turn-on and turn-off of the switching circuit according to the control signal. The current generation circuit is configured to generate the bias current responsive to the switching circuit being turned on. The current generation circuit includes a first MOS transistor and a second MOS transistor, an input terminal of the first MOS transistor and a control terminal of the first MOS transistor are connected to an output terminal of the switching circuit, an output terminal of the first MOS transistor is connected to an input terminal of the second MOS transistor and a control terminal of the second MOS transistor respectively, and an output terminal of the second MOS transistor is grounded.

The flash memory includes the above bias current generation circuit.

The details of one or more embodiments of the present disclosure are set forth in the accompanying drawings and description below. Other features, objects and advantages of the present disclosure will become apparent from the description, the drawings and the claims.

BRIEF DESCRIPTION OF THE DRAWINGS

In order to more clearly illustrate the technical solutions in the embodiments or exemplary techniques of this disclosure, the drawings required in the embodiments or exemplary technical descriptions will be briefly introduced below, and obviously, the drawings in the following description are merely some embodiments of the present disclosure, and those of ordinary skill in the art may obtain the accompanying drawings of other embodiments according to these drawings without creative efforts.

DETAILED DESCRIPTION

The terminologies in the semiconductor field used herein are common technical vocabularies used by a person skilled in the art. For example, for P-type and N-type impurities, in order to distinguish a doping concentration, a P+ type represents the P-type with a heavy doping concentration, a P-type represents the P-type with a medium doping concentration, a P− type represents the P-type with a light doping concentration, and a N+ type represents the N-type with a heavy doping concentration. a N-type represents the N-type with a medium doping concentration, and a N− type represents the N-type with a light doping concentration.

Figure 1:
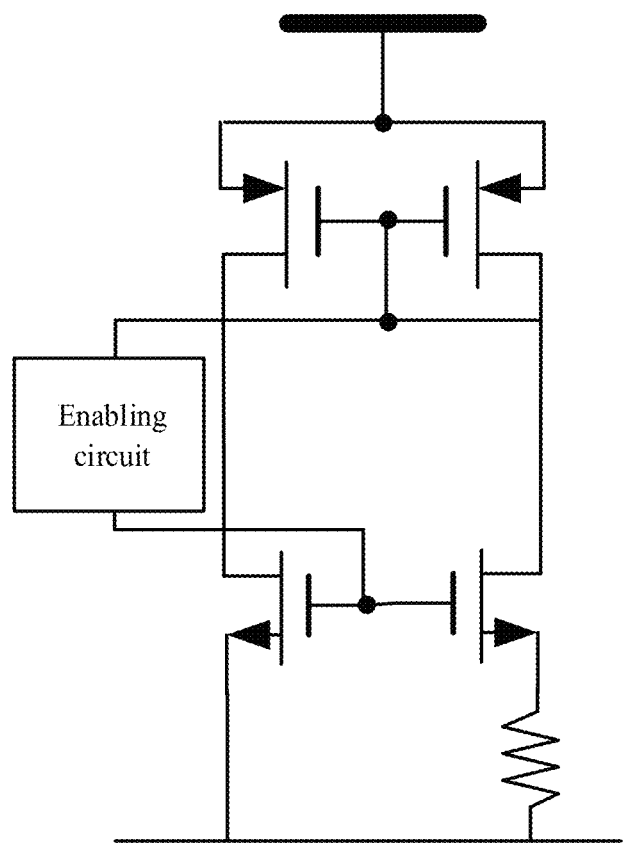
FIG. 1 is a circuit diagram of a conventional bias current generation circuit.
Figure 2:
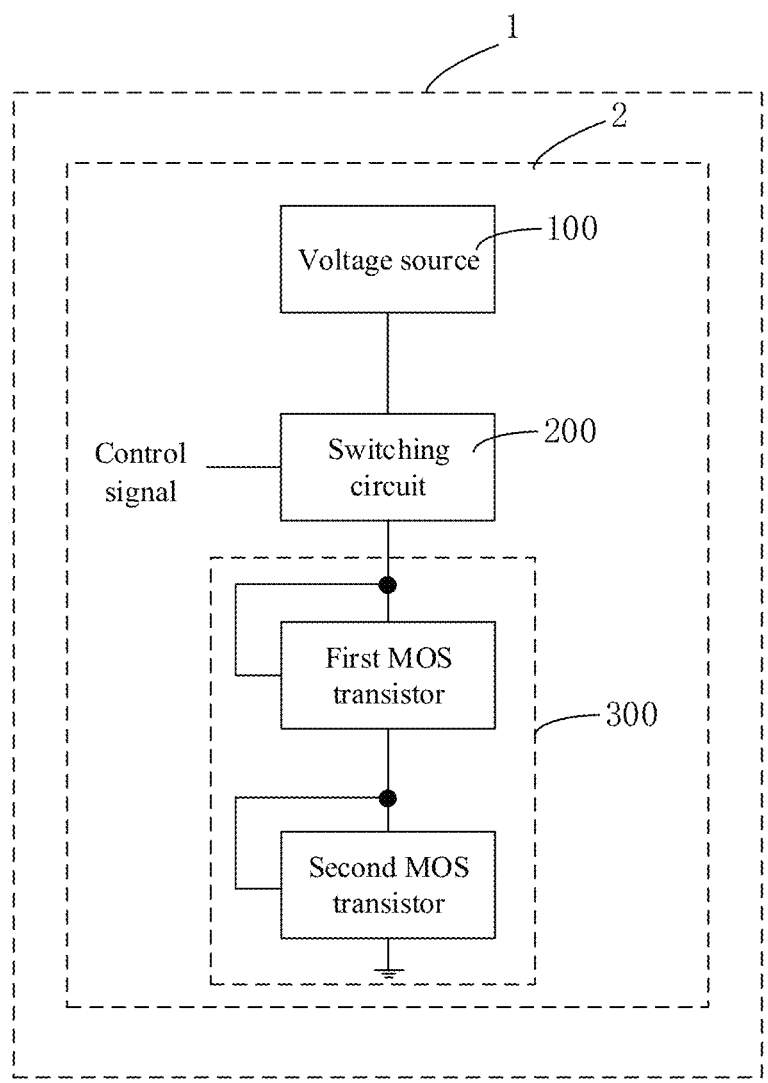
FIG. 2 is a block diagram of a bias current generation circuit according to an embodiment.

As shown in FIG. 2, in one embodiment, a bias current generation circuit includes a voltage source 100, a switching circuit 200 and a current generation circuit 300. The voltage source 100 is configured to provide a voltage for generating a bias current. An input terminal of the switching circuit 200 is connected to the voltage source 100, a control terminal of the switching circuit 200 is configured to receive a control signal and to control turn-on and turn-off of the switching circuit 200 according to the control signal. The current generation circuit 300 is configured to generate the bias current responsive to the switching circuit 200 being turned on. The current generation circuit 300 includes a first MOS transistor and a second MOS transistor. An input terminal of the first MOS transistor and a control terminal of the first MOS transistor are connected to an output terminal of the switching circuit 200, an output terminal of the first MOS transistor is connected to an input terminal of the second MOS transistor and a control terminal of the second MOS transistor respectively, and an output terminal of the second MOS transistor is grounded.

In one embodiment, the number of the voltage sources is one, and a voltage of the voltage source is greater than or equal to 1.3 volts and less than or equal to 1.5 volts.

In one embodiment, the switching circuit is turned off responsive to the control signal being at a high level, and the switching circuit is turned on responsive to the control signal being at a low level.

In one embodiment, the switching circuit is turned off responsive to the control signal being at a low level, and the switching circuit is turned on responsive to the control signal being at a high level.

Each of the first MOS transistor and the second MOS transistor is a diode-connected MOS transistor. A voltage difference is generated by a threshold voltage of the first MOS transistor and a threshold voltage of the second MOS transistor, and a bias current is generated accordingly.

In one embodiment, each of the first MOS transistor and the second MOS transistor is a MOS transistor of a first conductivity type. The first MOS transistor is an intrinsic MOS transistor, and the second MOS transistor is an extrinsic MOS transistor.

In the bias current generation circuit of the present disclosure, the current generation circuit is configured to provide the bias current. When the switching circuit is turned on, the voltage source applies a voltage for generating the bias current to the first MOS transistor and the second MOS transistor in the current generation circuit through the switching circuit, thereby generating the bias current. The bias current generation circuit can enter a state where the current is under normal operation without an enabling circuit, and a required bias current is generated accordingly. Compared with a circuit for generating bias current by using an enabling circuit, the present disclosure can set the bias current within a short time, which can satisfy the requirement of the flash IP on the setting time for the bias current.

Further, in a single-supply ultra-low power process, both an NMOS transistor and a PMOS transistor have a relatively high threshold voltage. Moreover, the first MOS transistor may have a body effect, and the threshold voltage of the first MOS transistor may be even higher, thus, a sum of a voltage between the control terminal and the output terminal of the first MOS transistor and a voltage between the control terminal and the output terminal of the second MOS transistor may be close to or more than 1.3 volts in an extreme case. If the voltage source VDD has a potential of 3 volts or even higher for selection, the bias current is generally large, which can meet the requirements of other circuits for operations. However, if the voltage source VDD just has a potential of 1.5 volts for selection, and if an actual voltage value of the voltage source VDD is 1.3 volts, the circuit may also provide a sufficient magnitude of bias current at a TT process corner, but the bias current may become too small and deviate from a desired value significantly when a process corner of the MOS transistor is shifted toward a SS process corner or the MOS transistor is operated at a low temperature, thereby affecting adversely a normal operation of other circuits. In the bias current generation circuit of the present disclosure, when the first MOS transistor is the intrinsic MOS transistor and the second MOS transistor is the extrinsic MOS transistor, the voltage between the control terminal and the output terminal of the first MOS transistor is close to 0 volt, and the sum of the voltage between the control terminal and the output terminal of the first MOS transistor and the voltage between the control terminal and the output terminal of the second MOS transistor in an extreme case is less than 1.3 volts, thereby avoiding the technical problem that when the actual voltage value of the voltage source VDD is 1.3 volts, the bias current may become too small and deviate from a desired value when a process corner of the MOS transistor is shifted toward the SS process corner or the MOS transistor is operated at a low temperature, affecting adversely a normal operation of other circuits. The first MOS transistor and the second MOS transistor are both diode-connected MOS transistors, that is, the control terminal of the first MOS transistor and the input terminal of the first MOS transistor are connected, the control terminal of the second MOS transistor and the input terminal of the second MOS transistor are connected, so that the control terminal of the first MOS transistor and the control terminal of the second MOS transistor may be applied with a relative high voltage as much as possible, thereby ensuring that the first MOS transistor and the second MOS transistor can be normally turned on (especially for the first MOS transistor). Therefore, in any cases, both the first MOS transistor and the second MOS transistor may be turned on, and the bias current IB would not be too small at certain process corners and low temperatures.

Herein, a supplemental explanation of the process corner will be given. Unlike a bipolar transistor, parameters of a metal oxide semiconductor field effect transistor (MOS transistor) are widely varied among different chips or among chips obtained from different batches of wafers. In order to facilitate designs of a digital circuit, the performance range of the MOS transistors is divided by a form of a process corner, that is, a speed fluctuation range of a NMOS and a PMOS transistor is limited in a rectangle determined by four corners. The four corners are: a fast NFET and a fast PFET, a slow NFET and a slow PFET, a fast NFET and a slow PFET, a slow NFET and a fast PFET. There are five process corners, i.e., a TT process corner, a FF process corner, a SS process corner, a FS process corner, and a SF process corner when employing a mode of five process corners. The TT refers to a NFET-typical corner & PFET-typical corner, the FS refers to a NFET-fast corner & PFET-slow corner. The term typical refers to that a driving current of the MOS transistor is at an average value, the term fast refers to that the drive current of the MOS transistor is at its maximum value, and the term slow refers to that the driving current of the MOS transistor is at its minimum value (this current is an Ids current). From a measurement perspective, it may be explained and understood as a carrier mobility being fast or slow.

In one embodiment, the first MOS transistor or the second MOS transistor is a MOS transistor of the first conductivity type. The first MOS transistor is the intrinsic MOS transistor, and the second MOS transistor is the extrinsic MOS transistor. That is, the first MOS transistor and the second MOS transistor are MOS transistors of different conductivity types.

In one embodiment, each of the first MOS transistor and the second MOS transistor is a MOS transistor of the second conductivity type. The first MOS transistor is the intrinsic MOS transistor, and the second MOS transistor is the extrinsic MOS transistor.

In one embodiment, the switching circuit is a third MOS transistor, and the third MOS transistor operates in a linear region when the switching circuit is turned on.

In one embodiment, the third MOS transistor is a MOS transistor of the second conductivity type, and the second conductivity type and the first conductivity type are opposite conductivity types.

In one embodiment, the third MOS transistor is a MOS transistor of the first conductivity type.

In one embodiment, the first MOS transistor is the intrinsic NMOS transistor, the second MOS transistor is a general NMOS transistor, and the third MOS transistor is a PMOS transistor. In this case, a substrate of the first MOS transistor and a substrate of the second MOS transistor are grounded, and a substrate of the third MOS transistor is connected to a power supply, such as the voltage source 100 or the like.

In one embodiment, the first MOS transistor is a PMOS transistor, the second MOS transistor is a general NMOS transistor, and the third MOS transistor is a PMOS transistor.

In one embodiment, the first MOS transistor is an intrinsic NMOS transistor, and both the second MOS transistor and the third MOS transistor are general NMOS transistors.

In one embodiment, the first MOS transistor is a PMOS transistor, and both the second MOS transistor and the third MOS transistor are general PMOS transistors.

In one embodiment, the current generation circuit 300 further includes a voltage dividing resistor R1. One end of the voltage dividing resistor R1 is connected to the output terminal of the switching circuit 200, and the other end of the voltage dividing resistor is connected to the input terminal of the first MOS transistor and the control terminal of the first MOS transistor respectively. The body effect is generated due to that a potential at the output terminal is higher than a potential at the substrate, the larger the voltage difference is, the more obvious the body effect is, and the higher the threshold voltage is. The voltage dividing resistor R1 is connected between the output terminal of the switching circuit 200 and the first MOS transistor, rather than being connected between the first MOS transistor and the second MOS transistor, so that the voltage difference between the potential at the output terminal of the first MOS transistor and the potential at the substrate of the first MOS transistor is relatively small, thereby reducing the body effect of the first MOS transistor, decreasing the threshold voltage of the first MOS transistor, and more easily obtaining a higher bias current. In addition, as a voltage of the voltage source rises to 1.65 volts, a generated bias current IB increases. The increased bias current IB results a large voltage drop on the resistor R1, while the voltage of the voltage source is unchanged, so that a sum of the voltage between the control terminal and the output terminal of the first MOS transistor and the voltage between the control terminal and the output terminal of the second MOS transistor is decreased accordingly. Generally, a bias current IB is proportional to a square of a difference value between a control terminal-to-output terminal voltage and a threshold voltage VT of a MOS transistor, in this case, the threshold voltage VT of the MOS transistor is a fixed value, thus, when the control terminal-to-output terminal voltage of the MOS transistor is deceased, the bias current IB is deceased accordingly. The resistor R functions as negative feedback, as a result, the bias current IB does not vary greatly.

In one embodiment, the voltage dividing resistor R1 is a variable resistor. The resistance value of the resistor R1 may be directly adjusted as needed, and the resistance value of the voltage dividing resistor in the bias current generation circuit may vary between a maximum resistance value of the variable resistor and a resistance value of zero, so that the bias current generation circuit can have strong testability.

In one embodiment, the voltage divider resistor R1 is a fixed resistor, e.g., with a resistance value of 220 kilo-ohms, 230 kilo-ohms, 250 kilo-ohms, 270 kilo-ohms, 300 kilo-ohms, 350 kilo-ohms, 400 kilo-ohms, 450 kilo-ohms, or the like. The resistance value of the voltage dividing resistor R1 may be selected according to requirements on static power consumption in the bias current generation circuit.

Figure 3:
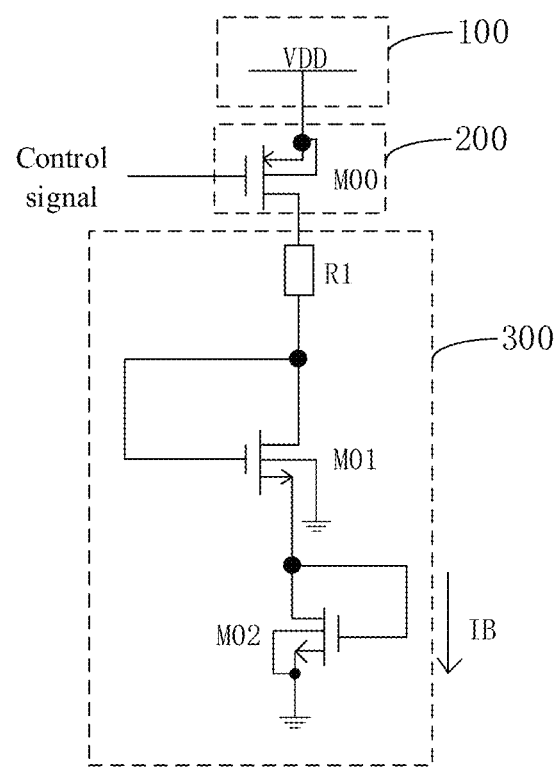
FIG. 3 is a circuit diagram of a bias current generation circuit according to an embodiment.

As shown in FIG. 3, in one embodiment, the switching circuit is a PMOS transistor M00, the first MOS transistor is an intrinsic NMOS transistor M01, and the second MOS transistor is a general NMOS transistor M02. A source and a substrate of the MOS transistor M00 are connected to the output terminal of the voltage source VDD, a gate of the MOS transistor M00 is configured to receive a control signal, and a drain of the MOS transistor M00 is connected to one end of the voltage dividing resistor R1, the other end of the voltage dividing resistor R1 is connected to a drain of the MOS transistor M01 and a gate of the MOS transistor M01, a source of the MOS transistor M01 is connected to a drain of the MOS transistor M02 and a gate of the MOS transistor M02 respectively, a source and a substrate of the MOS transistor M02 are grounded, a substrate of the MOS transistor M01 is grounded, that is, both the MOS transistor M01 and the MOS transistor M02 are diode-connected MOS transistors. When the control signal is at a high level, the MOS transistor M00 is turned off, the bias current generation circuit does not work, and no bias current is generated. In this case, the static power consumption of the bias current generation circuit is 0. When the control signal is at a low level, the MOS transistor M00 is turned on and operates in the linear region, an impedance of the MOS transistor M00 is about zero and may be negligible. In this case, in the bias current generation circuit, the bias current IB≈(VDD−VGS1−VGS2)/R1, where VDD is the voltage of the voltage source VDD, VGS1 is a gate-to-source voltage of the MOS transistor M01, VGS2 is a gate-to-source voltage of the MOS transistor M02, and R1 is a resistance value of the voltage dividing resistor R1.

In one embodiment, the resistance value of the voltage dividing resistor is greater than or equal to 200 kilo-ohms and less than or equal to 500 kilo-ohms, e.g., 220 kilo-ohms, 230 kilo-ohms, 250 kilo-ohms, 270 kilo-ohms, 300 kilo-ohms, 350 kilo-ohms, 400 kilo-ohms, 450 kilo-ohms, or the like. In other embodiments, the resistance value of the voltage dividing resistor may be selected according to the requirements on the static power consumption in the bias current generation circuit.

In one embodiment, the bias current generation circuit is used in a single power ultra-low power process.

The above bias current generation circuit includes the voltage source, the switching circuit and the current generation circuit. The voltage source is configured to provide the voltage for generating the bias current. The input terminal of the switching circuit is connected to the voltage source, the control terminal of the switching circuit is configured to receive the control signal and to control turn-on and turn-off of the switching circuit according to the control signal. The current generation circuit is configured to generate the bias current responsive to the switching circuit being turned on. The current generation circuit includes the first MOS transistor and the second MOS transistor, the input terminal of the first MOS transistor and the control terminal of the first MOS transistor are connected to the output terminal of the switching circuit, the output terminal of the first MOS transistor is connected to the input terminal of the second MOS transistor and the control terminal of the second MOS transistor respectively, and the output terminal of the second MOS transistor is grounded. In this solution, the current generation circuit for generating the bias current includes the first MOS transistor and the second MOS transistor, the input terminal of the first MOS transistor and the control terminal of the first MOS transistor are connected to the output terminal of the switching circuit, the input terminal of the switching circuit is connected to the voltage source, the output terminal of the first MOS transistor is connected to the input terminal of the second MOS transistor and the control terminal of the second MOS transistor respectively, and the output terminal of the second MOS transistor is grounded. When the switching circuit is turned on, the voltage source applies a voltage for generating the bias current to the first MOS transistor and the second MOS transistor in the current generation circuit through the switching circuit, and the current generation circuit generates the bias current accordingly. The bias current generation circuit can enter the state where the current is under normal operation without an enabling circuit, and a required bias current is generated accordingly. Compared with a circuit for generating the bias current by using an enabling circuit, the present disclosure can set the bias current within a short time, which can satisfy the requirement of the flash IP on the setting time for the bias current.

A flash memory 1 includes any of the above bias current generation circuits 2.

In one embodiment, the flash memory is a flash memory prepared by using a single power ultra-low power process.

The flash memory includes any of the above bias current generation circuits. In this flash memory, the current generation circuit for generating the bias current includes the first MOS transistor and the second MOS transistor, the input terminal of the first MOS transistor and the control terminal of the first MOS transistor are connected to the output terminal of the switching circuit, the input terminal of the switching circuit is connected to the voltage source, the output terminal of the first MOS transistor is connected to the input terminal of the second MOS transistor and the control terminal of the second MOS transistor respectively, and the output terminal of the second MOS transistor is grounded. When the switching circuit is turned on, the voltage source applies a voltage for generating the bias current to the first MOS transistor and the second MOS transistor in the current generation circuit through the switching circuit, and the current generation circuit generates the bias current accordingly. The bias current generation circuit can enter the state where the current is under normal operation without an enabling circuit, and a required bias current is generated accordingly. Compared with a circuit for generating the bias current by using an enabling circuit, the present disclosure can set the bias current within a short time, which can satisfy the requirement of the flash IP on the setting time for the bias current.

The technical features of the above-described embodiments may be arbitrarily combined. In order to make the description simple, not all possible combinations of the technical features in the above embodiments are described. However, in the case that there is no contradiction in the combination of these technical features, these combinations should be considered to be within the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the application protection of the present disclosure shall be defined by the appended claims.

What is claimed is:

1. A bias current generation circuit, comprising:
a voltage source configured to provide a voltage for generating a bias current;
a switching circuit, an input terminal of the switching circuit being connected to the voltage source, a control terminal of the switching circuit being configured to receive a control signal and to control turn-on and turn-off of the switching circuit according to the control signal;
a current generation circuit configured to generate a bias current responsive to the switching circuit being turned on; the current generation circuit comprising a first MOS transistor and a second MOS transistor, an input terminal of the first MOS transistor and a control terminal of the first MOS transistor being connected to an output terminal of the switching circuit, an output terminal of the first MOS transistor being connected to an input terminal of the second MOS transistor and a control terminal of the second MOS transistor respectively, and an output terminal of the second MOS transistor being grounded; and
a voltage dividing resistor, one end of the voltage dividing resistor is connected to the output terminal of the switching circuit, and the other end of the voltage dividing resistor is connected to the input terminal of the first MOS transistor and the control terminal of the first MOS transistor respectively;
wherein the voltage dividing resistor is a variable resistor.

2. The bias current generation circuit according to claim 1, wherein the voltage dividing resistor is a fixed resistor.

3. The bias current generation circuit according to claim 1, wherein the switching circuit is turned off responsive to the control signal being at a high level, and the switching circuit is turned on responsive to the control signal being at a low level.

4. The bias current generation circuit according to claim 1, wherein the switching circuit comprises a third MOS transistor, and the third MOS transistor is configured to operate in a linear region responsive to the switching circuit being turned on.

5. The bias current generation circuit according to claim 4, wherein the third MOS transistor is a MOS transistor of a first conductivity type.

6. The bias current generation circuit according to claim 4, wherein the third MOS transistor is a MOS transistor of a second conductivity type.

7. The bias current generation circuit according to claim 4, wherein the first MOS transistor is an intrinsic NMOS transistor, the second MOS transistor is a general NMOS transistor, and the third MOS transistor is a PMOS transistor; a substrate of the first MOS transistor and a substrate of the second MOS transistor are grounded, and a substrate of the third MOS transistor is connected to the voltage source.

8. The bias current generation circuit according to claim 4, wherein the first MOS transistor is a PMOS transistor, the second MOS transistor is a general NMOS transistor, and the third MOS transistor is a PMOS transistor.

9. The bias current generation circuit according to claim 4, wherein the first MOS transistor is an intrinsic NMOS transistor, and both the second MOS transistor and the third MOS transistor are general NMOS transistors.

10. The bias current generation circuit according to claim 4, wherein the first MOS transistor is a PMOS transistor, and both the second MOS transistor and the third MOS transistor are general PMOS transistors.

11. The bias current generation circuit according to claim 1, wherein each of the first MOS transistor and the second MOS transistor is a MOS transistor of a first conductivity type, the first MOS transistor is an intrinsic MOS transistor, and the second MOS transistor is an extrinsic MOS transistor.

12. The bias current generation circuit according to claim 1, wherein one of the first MOS transistor and the second MOS transistor is a MOS transistor of a first conductivity type, the first MOS transistor is an intrinsic MOS transistor, and the second MOS transistor is an extrinsic MOS transistor.

13. The bias current generation circuit according to claim 1, wherein a resistance value of the voltage dividing resistor is greater than or equal to 200 kilo-ohms and less than or equal to 500 kilo-ohms.

14. The bias current generation circuit according to claim 1, wherein the number of the voltage sources is one, and a voltage of the voltage source is greater than or equal to 1.3 volts and less than or equal to 1.5 volts.

15. The bias current generation circuit according to claim 1, wherein the bias current generation circuit is used in a single-supply ultra-low power process.

16. The bias current generation circuit according to claim 1, wherein the switching circuit is turned off responsive to the control signal being at a low level, and the switching circuit is turned on responsive to the control signal being at a high level.

17. A flash memory, comprising the bias current generation circuit according to claim 1.

\* \* \* \* \*